United States Patent
Wang et al.

(10) Patent No.: US 8,518,206 B2
(45) Date of Patent: Aug. 27, 2013

(54) METHOD FOR MAKING CARBON NANOTUBE COMPOSITE STRUCTURE

(75) Inventors: Jia-Ping Wang, Beijing (CN); Rui Xie, Beijing (CN); Kai-Li Jiang, Beijing (CN); Shou-Shan Fan, Beijing (CN)

(73) Assignees: Tsinghua University, Beijing (CN); Hon Hai Precision Industry Co., Ltd., New Taipei (TW)

(*) Notice: Subject to any disclaimer, the term of this patent is extended or adjusted under 35 U.S.C. 154(b) by 150 days.

(21) Appl. No.: 13/093,850

(22) Filed: Apr. 26, 2011

(65) Prior Publication Data

US 2012/0103510 A1    May 3, 2012

(30) Foreign Application Priority Data

Oct. 29, 2010   (CN) .......................... 2010 1 0524918

(51) Int. Cl.
- *C23C 14/28* (2006.01)
- *B32B 37/16* (2006.01)
- *B82Y 30/00* (2011.01)
- *B82Y 40/00* (2011.01)

(52) U.S. Cl.
USPC ........ 156/272.2; 427/495; 977/742; 977/842; 423/447.1; 428/608

(58) Field of Classification Search
USPC ........ 156/272.2; 427/595; 423/447.1–447.3, 423/445 B; 977/742–754, 842–848; 428/367
See application file for complete search history.

(56) References Cited

U.S. PATENT DOCUMENTS

| | | | |
|---|---|---|---|
| 7,413,763 | B2 | 8/2008 | Chao et al. |
| 2004/0047038 | A1* | 3/2004 | Jiang et al. ................. 359/486 |
| 2004/0180244 | A1 | 9/2004 | Tour et al. |
| 2004/0222080 | A1* | 11/2004 | Tour et al. ............... 204/157.15 |
| 2008/0063860 | A1 | 3/2008 | Song et al. |
| 2008/0170982 | A1* | 7/2008 | Zhang et al. ............... 423/447.3 |
| 2008/0239489 | A1 | 10/2008 | Feng et al. |
| 2009/0159198 | A1 | 6/2009 | Wang et al. |
| 2009/0286013 | A1 | 11/2009 | Cook et al. |
| 2010/0206469 | A1 | 8/2010 | Van Wijngaarden |
| 2010/0247820 | A1 | 9/2010 | Krisko et al. |

FOREIGN PATENT DOCUMENTS

| | | |
|---|---|---|
| CN | 101276012 | 10/2008 |
| CN | 101462391 | 6/2009 |
| CN | 101831264 | 9/2010 |
| JP | 2002-46185 | 2/2002 |
| JP | 2004-31679 | 1/2004 |

(Continued)

OTHER PUBLICATIONS

"Polystyrene MSDS," accessed online at http://www.videolar.com.br/PDF/especificacoes/GPPS%20(INGL%C3%8AS).pdf on Dec. 6, 2012.*

(Continued)

*Primary Examiner* — Daniel C McCracken
(74) *Attorney, Agent, or Firm* — Altis Law Group, Inc.

(57) ABSTRACT

A method for making a carbon nanotube composite structure is provided. First, a matrix having a surface and a carbon nanotube structure are provided. The carbon nanotube structure is placed on the surface of the matrix. The carbon nanotube structure includes a plurality of carbon nanotubes. The carbon nanotube structure and the matrix are exposed to electromagnetic waves.

19 Claims, 11 Drawing Sheets

(56) References Cited

FOREIGN PATENT DOCUMENTS

| JP | 2008-62644 | 3/2008 |
|----|------------|--------|
| JP | 2009-538971 | 11/2009 |
| JP | 2010-513175 | 4/2010 |
| JP | 2010-137372 | 6/2010 |
| TW | I253094 | 4/2006 |
| TW | I276140 | 3/2007 |

OTHER PUBLICATIONS

Mei Zhang et al, "Strong, Transparent, Multifunctional, Carbon Nanotube Sheets", Science, vol. 309, pp. 1215-1219, Aug. 19, 2005.
C. Y. Wang et al, "Flexible field emitter made of carbon nanotubes microwave welded onto polymer substrates", Applied Physics Letters, vol. 90 Issue 10, pp. 103111-1-103111-3, Mar. 7, 2007.

* cited by examiner

```
┌─────────────────────────────────────────────────────────────────┐
│ providing a matrix having a surface and a carbon nanotube       │
│ structure;                                                      │
└─────────────────────────────────────────────────────────────────┘
                                │
                                ▼
┌─────────────────────────────────────────────────────────────────┐
│ placing the carbon nanotube structure on the surface of the     │
│ matrix, the carbon nanotube structure includes a plurality of   │
│ carbon nanotubes and a plurality of pores; and                  │
└─────────────────────────────────────────────────────────────────┘
                                │
                                ▼
┌─────────────────────────────────────────────────────────────────┐
│ exposing the carbon nanotube structure to electromagnetic waves.│
└─────────────────────────────────────────────────────────────────┘
```

FIG. 1

METHOD FOR MAKING CARBON NANOTUBE COMPOSITE STRUCTURE

RELATED APPLICATIONS

This application claims all benefits accruing under 35 U.S.C. §119 from China Patent Application No. 201010524918.8, filed on Oct. 29, 2010 in the China Intellectual Property Office, the disclosure of which is incorporated herein by reference. The application is also related to copending applications entitled, "METHOD FOR BONDING MEMBERS", filed on Apr. 26, 2011, with Ser. No. 13/093,849; "CARBON NANOTUBE COMPOSITE STRUCTURE", filed on Apr. 26, 2011, with Ser. No. 13/093,851.

BACKGROUND

1. Technical Field

The present disclosure relates to composites, particularly, to a carbon nanotube composite structure and a method for making the same.

2. Description of Related Art

Carbon nanotubes (CNT) are a novel carbonaceous material having extremely small size and extremely large specific surface area. Carbon nanotubes have interesting and potentially useful electrical and mechanical properties, and have been widely used in a plurality of fields such as emitters, gas storage and separation, chemical sensors, and high strength composites.

However, the main obstacle in applying carbon nanotubes is the difficulty in processing the common powder form of the carbon nanotube products. Therefore, forming separate and tiny carbon nanotubes into manipulable carbon nanotube structures is necessary.

Carbon nanotube composite structure is one kind of manipulable carbon nanotube structures. A method for producing many carbon nanotube composite structures includes a stirring step or vibration step to disperse carbon nanotube powder in the composite matrix. However, carbon nanotubes have extremely high surface energy and are prone to aggregate. Therefore, it is very difficult to achieve a composite with carbon nanotubes evenly dispersed therein. Furthermore, the carbon nanotubes are dispersed in the whole matrix in the carbon nanotube composite structure produced by this method, conductivity of a surface of the carbon nanotube composite structure is low, which limits the application of the carbon nanotube composite structure.

What is needed, therefore, is a carbon nanotube composite structure and method for making the same that can overcome the above-described shortcomings.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments.

Moreover, in the drawings, like reference numerals designate corresponding parts throughout the several views.

FIG. 1 is a flow chart according to one embodiment of a method for making a carbon nanotube composite structure.

DETAILED DESCRIPTION

Figure 2:
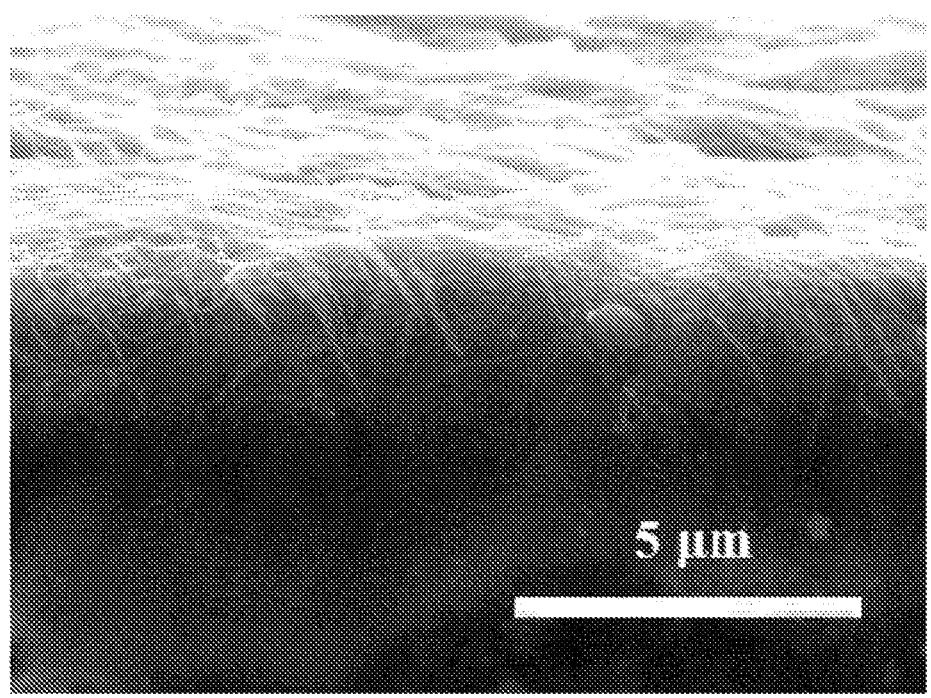
FIG. 2 is a Scanning Electron Microscope (SEM) image of a side surface of the carbon nanotube composite structure.

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

One embodiment of a method for making a carbon nanotube composite structure is illustrated in FIG. 1. The method includes the following steps:

(a) providing a matrix having a surface and a carbon nanotube structure;

(b) placing the carbon nanotube structure on the surface of the matrix, the carbon nanotube structure including a plurality of carbon nanotubes and a plurality of pores; and (c) exposing the carbon nanotube structure and the matrix to electromagnetic waves.

In step (a), the matrix can be made of ceramic, glass, or polymeric materials. Examples of the polymeric materials comprise polyethylene, epoxide resin, bismaleimide resin, cyanate resin, polypropylene, polyethylene, polyvinyl alcohol, polystyrene enol, polycarbonate, and polymethylmethacrylate. The shape of the matrix is not limited. In one embodiment, the matrix is a cuboid made of polyethylene, a thickness of the matrix is about 3 millimeters. The surface is a square, and a side of the surface is about 50 millimeters.

In step (b), the carbon nanotube structure includes a plurality of carbon nanotubes combined by van der Waals force therebetween. The carbon nanotube structure can be a substantially pure structure of the carbon nanotubes, with few impurities. The heat capacity per unit area of the carbon nanotube structure can be less than $2\times10^{-4}$ J/m$^2$*K. In one embodiment, the heat capacity per unit area of the carbon nanotube structure 120 is less than or equal to $1.7\times10{-6}$ J/m$^2$*K. As the heat capacity of the carbon nanotube structure 120 is very low, this makes the carbon nanotube structure have a high heating efficiency, a high response heating speed, and accuracy. Furthermore, the carbon nanotubes have a low density, about 1.35 g/cm$^3$, so the carbon nanotube structure is light. The carbon nanotube structure includes a plurality of micropores, and diameters of these micropores can be less than 10 micrometers. As the carbon nanotube has large specific surface area and the carbon nanotube structure includes a plurality of micropores, the carbon nanotube structure with a plurality of carbon nanotubes has large specific surface area. When the specific surface of the carbon nanotube structure is large enough, the carbon nanotube structure is adhesive and can be directly applied to a surface. The carbon nanotube structure can be adhered on the surface directly without extra adhesive material.

The carbon nanotubes in the carbon nanotube structure can be orderly or disorderly arranged. The term 'disordered carbon nanotube structure' refers to a structure where the carbon nanotubes are arranged along different directions, and the alignment directions of the carbon nanotubes are random. The number of the carbon nanotubes arranged along each different direction can be almost the same (e.g. uniformly disordered). The disordered carbon nanotube structure can be isotropic, namely the carbon nanotube film has properties identical in all directions of the carbon nanotube film. The carbon nanotubes in the disordered carbon nanotube structure can be entangled with each other.

The carbon nanotube structure can be an ordered carbon nanotube structure. The term 'ordered carbon nanotube structure' refers to a structure where the carbon nanotubes are arranged in a consistently systematic manner, e.g., the carbon nanotubes are arranged approximately along a same direction and/or have two or more sections within each of which the carbon nanotubes are arranged approximately along a same direction (different sections can have different directions). The carbon nanotubes in the carbon nanotube structure 120 can be selected from single-walled, double-walled, and/or multi-walled carbon nanotubes. The carbon nanotube structure includes at least one carbon nanotube film. The carbon nanotube film can be a drawn carbon nanotube film, a pressed carbon nanotube film, or a flocculated carbon nanotube film.

The drawn carbon nanotube film includes a plurality of successive and oriented carbon nanotubes joined end-to-end by van der Waals force therebetween. The drawn carbon nanotube film is a free-standing film. A method of making a drawn carbon nanotube film includes the steps of:

Sb1: providing an array of carbon nanotubes; and
Sb2: pulling out at least a drawn carbon nanotube film from the carbon nanotube array.

In step Sb1, a method of making the array of carbon nanotubes includes:

Sb11: providing a substantially flat and smooth substrate;
Sb12: applying a catalyst layer on the substrate;
Sb13: annealing the substrate with the catalyst at a temperature in the approximate range of about 700° C. to about 900° C. in air for about 30 to about 90 minutes;
Sb14: heating the substrate with the catalyst at a temperature in the approximate range from about 500° C. to about 740° C. in a furnace with a protective gas therein; and
Sb15: supplying a carbon source gas to the furnace for about 5 to about 30 minutes and growing a super-aligned array of the carbon nanotubes from the substrate.

In step Sb11, the substrate can be a P or N-type silicon wafer. In one embodiment, a 4-inch P-type silicon wafer is used as the substrate.

In step Sb12, the catalyst can be made of iron (Fe), cobalt (Co), nickel (Ni), or any combination alloy thereof.

In step Sb14, the protective gas can be made up of at least one of nitrogen ($N_2$), ammonia ($NH_3$), and a noble gas.

In step Sb15, the carbon source gas can be a hydrocarbon gas, such as ethylene ($C_2H_4$), methane ($CH_4$), acetylene ($C_2H_2$), ethane ($C_2H_6$), or any combination thereof.

In step Sb2, the drawn carbon nanotube film can be fabricated by the steps of:

Sb21: selecting one or more carbon nanotubes having a predetermined width from the array of carbon nanotubes; and
Sb22: pulling the carbon nanotubes to obtain nanotube segments at an even/uniform speed to achieve a uniform carbon nanotube film.

In step Sb21, the carbon nanotube segment includes a number of substantially parallel carbon nanotubes. The carbon nanotube segments can be selected by using an adhesive tape as the tool to contact the super-aligned array of carbon nanotubes. In step Sb22, the pulling direction can be substantially perpendicular to the growing direction of the super-aligned array of carbon nanotubes.

More specifically, during the pulling process, as the initial carbon nanotube segments are drawn out, other carbon nanotube segments are also drawn out end to end due to van der Waals force between ends of adjacent segments. This process of pulling produces a substantially continuous and uniform carbon nanotube film having a predetermined width can be obtained.

After the step of Sb2, the drawn carbon nanotube film can be treated by applying organic solvent to the drawn carbon nanotube film to soak the entire surface of the carbon nanotube film. The organic solvent is volatile and can be selected from ethanol, methanol, acetone, dichloromethane, chloroform, or any appropriate mixture thereof. In the one embodiment, the organic solvent is ethanol. After being soaked by the organic solvent, adjacent carbon nanotubes in the carbon nanotube films that are able to do so, bundle together, due to the surface tension of the organic solvent when the organic solvent is volatilizing. In another aspect, due to the decrease of the specific surface area from the bundling, the mechanical strength and toughness of the drawn carbon nanotube film are increased and the coefficient of friction of the carbon nanotube films is reduced. Macroscopically, the drawn carbon nanotube film will be an approximately uniform film.

The width of the drawn carbon nanotube film depends on the size of the carbon nanotube array. The length of the drawn carbon nanotube film can be set as desired. In one embodiment, when the substrate is a 4 inch type wafer, a width of the carbon nanotube film can be in an approximate range from 1 centimeter (cm) to 10 cm, the length of the carbon nanotube film can reach to about 120 m, the thickness of the drawn carbon nanotube film can be in an approximate range from 0.5 nm to 100 microns. Multiple films can be adhered together to obtain a film of any desired size.

If the carbon nanotube structure includes a number of stacked drawn carbon nanotube films, and the number of the stacked drawn carbon nanotube films are fabricated according to following steps:

(1) providing a number of drawn carbon nanotube film, adhering one drawn carbon nanotube film to a frame;

(2) depositing other drawn carbon nanotube films on the preceding drawn carbon nanotube film successively, thereby achieving at least a two-layer drawn carbon nanotube film; and (3) peeling the plurality of stacked drawn carbon nanotube films off the frame to achieve the plurality of stacked drawn carbon nanotube films.

The carbon nanotubes in the pressed carbon nanotube film are arranged along a same direction or along different directions. The carbon nanotubes in the pressed carbon nanotube film can rest upon each other. A method of making the pressed carbon nanotube film includes the following steps:

Sb1': providing a carbon nanotube array and a pressing device; and
Sb2': pressing the array of carbon nanotubes to obtain a pressed carbon nanotube film.

In step Sb1', the carbon nanotube array can be made by the same method as Sb1.

In the step Sb2', a certain pressure can be applied to the array of carbon nanotubes by the pressing device. In the process of pressing, the carbon nanotubes in the array of carbon nanotubes separate from the substrate and obtain the carbon nanotube film under pressure. The carbon nanotubes are substantially parallel to a surface of the carbon nanotube film.

In one embodiment, the pressing device can be a pressure head. The pressure head has a smooth surface. The shape of the pressure head and the pressing direction can determine the direction of the carbon nanotubes arranged therein. When a pressure head (e.g. a roller) is used to travel across and press the array of carbon nanotubes along a predetermined single direction, a carbon nanotube film having a number of carbon nanotubes primarily aligned along a same direction is obtained. It can be understood that there may be some variation in the film. Different alignments can be achieved by applying the roller in different directions over an array. Variations on the film can also occur when the pressure head is used to travel across and press the array of carbon nanotubes several times, variation will occur in the orientation of the nanotubes. Variations in pressure can also achieve different angles between the carbon nanotubes and the surface of the semiconducting layer on the same film. When a planar pressure head is used to press the array of carbon nanotubes along the direction perpendicular to the substrate, a carbon nanotube film having a number of carbon nanotubes isotropically arranged can be obtained. When a roller-shaped pressure head is used to press the array of carbon nanotubes along a certain direction, a carbon nanotube film having a number of carbon nanotubes aligned along the certain direction is obtained. When a roller-shaped pressure head is used to press the array of carbon nanotubes along different directions, a carbon nanotube film having a number of sections having carbon nanotubes aligned along different directions is obtained.

The flocculated carbon nanotube film can include a plurality of long, curved, disordered carbon nanotubes entangled with each other. Furthermore, the flocculated carbon nanotube film can be isotropic. The flocculated carbon nanotube film can be made by the following method:

Sb1": providing a carbon nanotube array;
    Sb2": separating the array of carbon nanotubes from the substrate to get a number of carbon nanotubes;
    Sb3": adding the number of carbon nanotubes to a solvent to get a carbon nanotube floccule structure in the solvent; and
    Sb4": separating the carbon nanotube floccule structure from the solvent, and shaping the separated carbon nanotube floccule structure into a carbon nanotube film to achieve a flocculated carbon nanotube film.

In step Sb1", the carbon nanotube array can be fabricated by the same method as step Sb1.

In step Sb2", the array of carbon nanotubes is scraped off the substrate to obtain a number of carbon nanotubes. The length of the carbon nanotubes can be above 10 microns.

In step Sb3", the solvent can be selected from water or volatile organic solvent. After adding the number of carbon nanotubes to the solvent, a process of flocculating the carbon nanotubes can, be suitably executed to create the carbon nanotube floccule structure. The process of flocculating the carbon nanotubes can be selected from ultrasonic dispersion of the carbon nanotubes or agitating the carbon nanotubes. In one embodiment ultrasonic dispersion is used to flocculate the solvent containing the carbon nanotubes for about 10~30 minutes. Due to the carbon nanotubes in the solvent having a large specific surface area and the tangled carbon nanotubes having a large van der Waals force, the flocculated and tangled carbon nanotubes obtain a network structure (e.g., floccule structure).

In step Sb4", the process of separating the floccule structure from the solvent includes the sub-steps of:

Sb4"1: filtering out the solvent to obtain the carbon nanotube floccule structure; and
    Sb4"2: drying the carbon nanotube floccule structure to obtain the separated carbon nanotube floccule structure.

In step Sb4"1, the carbon nanotube floccule structure can be disposed in room temperature for a period of time to dry the organic solvent therein. The time of drying can be selected according to practical needs. The carbon nanotubes in the carbon nanotube floccule structure are tangled together.

In step Sb4"2, the process of shaping includes the sub-steps of:

Sb4"21: putting the separated carbon nanotube floccule structure on a supporter (not shown), and spreading the carbon nanotube floccule structure to obtain a predetermined structure;
    Sb4"22: pressing the spread carbon nanotube floccule structure with a determined pressure to yield a desirable shape; and
    Sb4"23: removing the residual solvent contained in the spread floccule structure to obtain the flocculated carbon nanotube film.

Through flocculating, the carbon nanotubes are tangled together by van der Waals force to obtain a network structure/floccule structure. Thus, the flocculated carbon nanotube film has good tensile strength.

In one embodiment, the carbon nanotube structure is a drawn carbon nanotube film. The carbon nanotube structure is disposed on the surface of the matrix.

In the step (c), a power of the electromagnetic waves can be in a range from about 200 W to about 2000 W. The power of the electromagnetic wave is determined by the melting point of the materials of the matrix. The higher the melting points of the materials, the higher the power of the electromagnetic wave. The electromagnetic wave can be radio frequency, microwave, near infrared or far infrared. In one embodiment, the electromagnetic waves are microwaves. A power of the microwaves can be in a range from about 200 W to about 1500 W. A frequency of the microwaves can be in a range from about 1 GHz to about 10 GHz. The carbon nanotube structure and the matrix are kept and heated in the chamber filled with microwaves for about 1 second to about 300 seconds. In other embodiments, the carbon nanotube structure and the matrix are kept and heated in the chamber filled with microwaves about 3 seconds to about 90 seconds. The time the carbon nanotube structure and the matrix heated in the chamber filled with microwaves depends on the material of the matrix, and the power of the microwaves. The higher the melting points of the materials of the matrix, the longer the time. The higher the power of the microwaves, the shorter the time the chamber needs to be filled. In one embodiment, the time is about 30 seconds.

In the step (c), the carbon nanotube structure is exposed in the electromagnetic waves until a portion of the matrix is melted and permeates into pores of the carbon nanotube structure. In one embodiment, the carbon nanotube structure located on the matrix surface can be placed into a chamber filled with electromagnetic waves. The materials of the matrix are polymer and barely absorbing energy of electromagnetic waves; as such, the matrix will not be heated by the electromagnetic waves. The carbon nanotube structure located on the surface of the matrix can absorb the energy of the microwaves and generate heat. Because the carbon nanotube structure has a small heat capacity per unit area, a temperature of the carbon nanotube structure rises quickly. This temperature increase will heat the surface of the matrix until the carbon nanotube structure is able to infiltrate the matrix. In one embodiment, the surface of the matrix is melted by the heat, and liquid matrix is present on the surface. Because wettability of the liquid matrix and the carbon nanotube structure is good, the liquid matrix will infiltrate into micropores of the carbon nanotube structure, as such, the carbon nanotube structure will be coated by the liquid matrix. After the liquid matrix wets the whole carbon nanotube structure, the material of matrix will stop moving into the micropores and the micropores will be full of the matrix material. In other words, the carbon nanotube structure settle into the matrix, below the surface of the matrix. A perpendicular distance D between the surface of the matrix and the carbon nanotubes in the carbon nanotube structure is less than 10 micrometers, that is to say, a thickness of part of the matrix above the carbon nanotube structure is less than 10 micrometers. The heat generated by the carbon nanotube structure can be absorbed by the surface of the matrix, and the temperature of the carbon nanotube structure can be controlled under 700° C., and the carbon nanotube structure will not burn.

In one embodiment, the matrix is made of polyethylene, which has a melting point of about 137° C., the carbon nanotube structure and the matrix can be kept in the chamber filled with microwaves until the temperatures of the surface reaches or gets a little higher than the melting point of about 137° C. The carbon nanotube structure and the matrix can be kept in the chamber for about 10 seconds, and the carbon nanotube structure will embed in matrix.

Step (c) can be carried out in vacuum environment of about $10^{-2}$ Pascals to about $10^{-6}$ Pascals, or in a specific atmosphere of protective gases including nitrogen gas and inert gases. The carbon nanotube structure 120 can generate a lot of heat and reach the temperature of about 2000° C. to embed into a matrix, which has high melting points when the carbon nanotube structure 120 works in vacuum environment or in a specific atmosphere.

The method for making the carbon nanotube composite structure has the following advantages: first, the surface of the matrix is heated to form the carbon nanotube composite structure, there is no need to heat the whole matrix, the matrix will not be destroyed and energy is saved. Second, the method for making the carbon nanotube composite structure can keep the thickness of the matrix above the carbon nanotube structure less than 10 micrometers, as such, the surface of the carbon nanotube composite structure is conductive. Furthermore, methods, described herein, for making the carbon nanotube composite are relatively simple and easy to perform.

Figure 3:
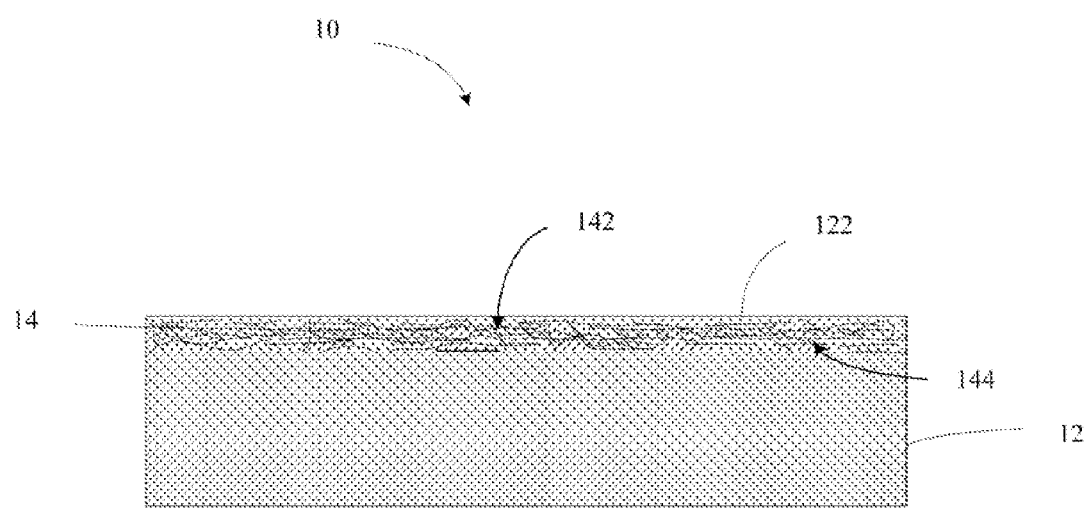
FIG. 3 is a schematic view of the side surface of the carbon nanotube composite structure.

Referring to FIGS. 2 and 3, a carbon nanotube composite structure 10 made by the above method is also provided. The carbon nanotube composite structure 10 includes a matrix 12 and a carbon nanotube structure 14. The matrix 12 includes a top surface 122, the carbon nanotube structure 14 is embedded in the matrix 12 and below the surface 122. The carbon nanotube structure 14 includes a first surface 142 and a second surface 144 opposite with the first surface 142. The first surface 142 is near the top surface 122 of the matrix. A perpendicular distance D between the top surface 122 and the first surface 142 of carbon nanotube structure 14 is less than 10 micrometers. In some embodiments, the perpendicular distance D between the surface 122 and the carbon nanotube structure is ranged from about 10 nanometers to about 200 nanometers.

The matrix 12 can be ceramic, glass, or polymeric materials. Examples of the polymeric materials comprise polyethylene, epoxide resin, bismaleimide resin, cyanate resin, polypropylene, polyethylene, polyvinyl alcohol, polystyrenenol, polycarbonate, and polymethylmethacrylate. A melting point of the matrix 12 can be less than 600° C.

The carbon nanotube structure 14 includes a plurality of carbon nanotubes combined by van der Waals force therebetween. The carbon nanotube structure 14 can be a substantially pure structure of the carbon nanotubes, with few impurities. A thickness of the carbon nanotube structure can be in a range from about 50 nanometers to about 10 micrometers. The carbon nanotube structure 14 includes a plurality of micropores, and diameters of these micropores can be less than 10 micrometers. The micropores can be defined by distance between adjacent carbon nanotubes. The carbon nanotubes in the carbon nanotube structure 14 can be orderly or disorderly arranged.

Figure 4:
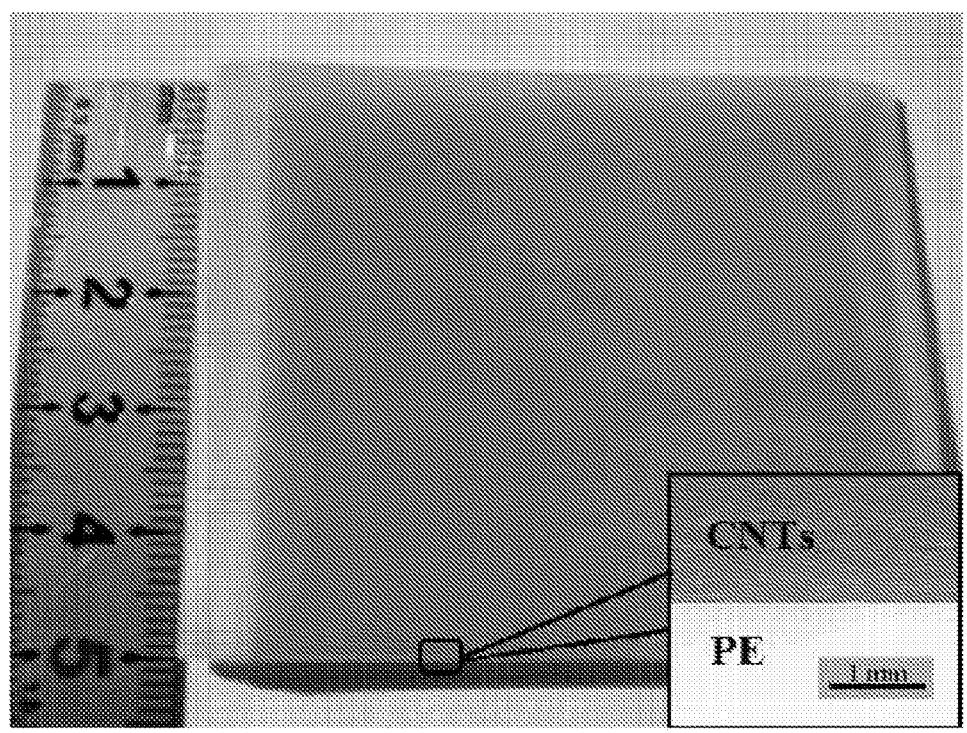
FIG. 4 is a photo of a surface of the carbon nanotube composite structure and a magnifying photo of part of the surface of the carbon nanotube composite structure.
Figure 5:
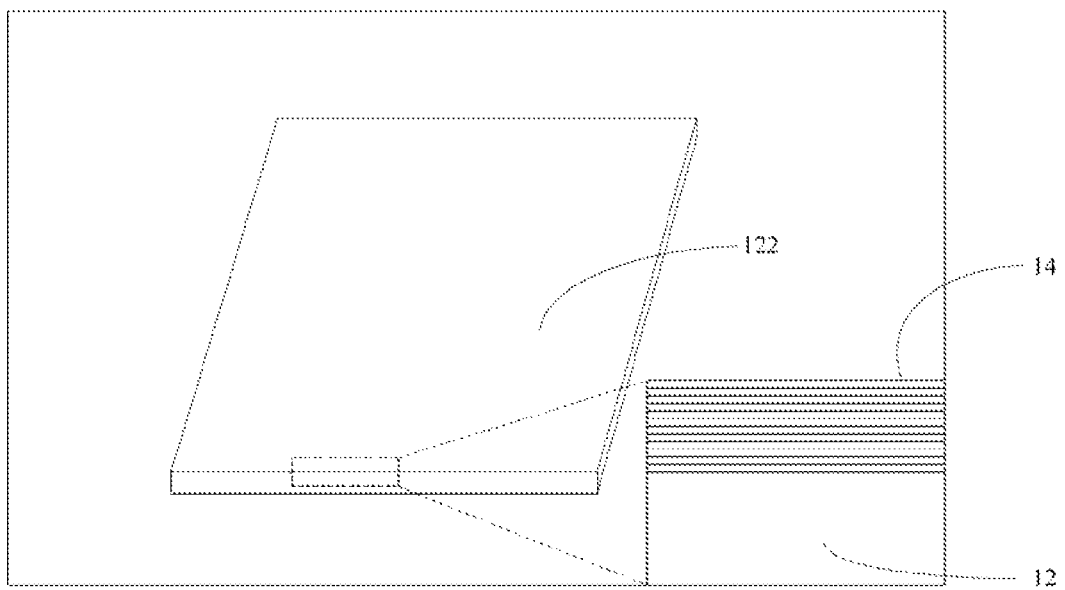
FIG. 5 is a schematic view of the surface of the carbon nanotube structure in FIG. 4.
Figure 6:
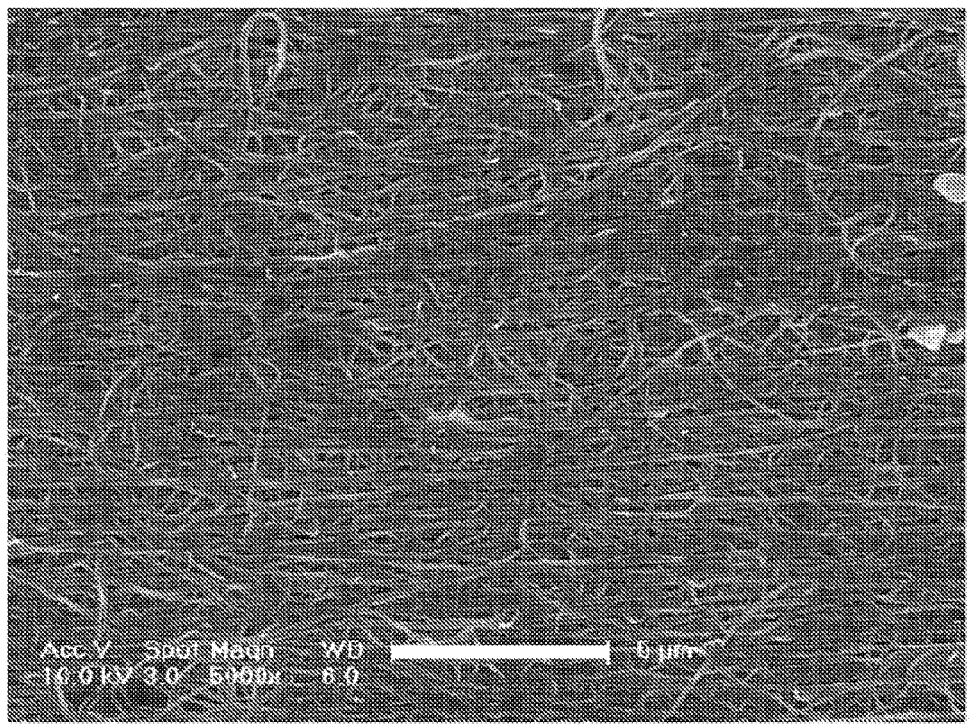
FIG. 6 is an SEM image of a top surface of the carbon nanotube composite structure.
Figure 7:
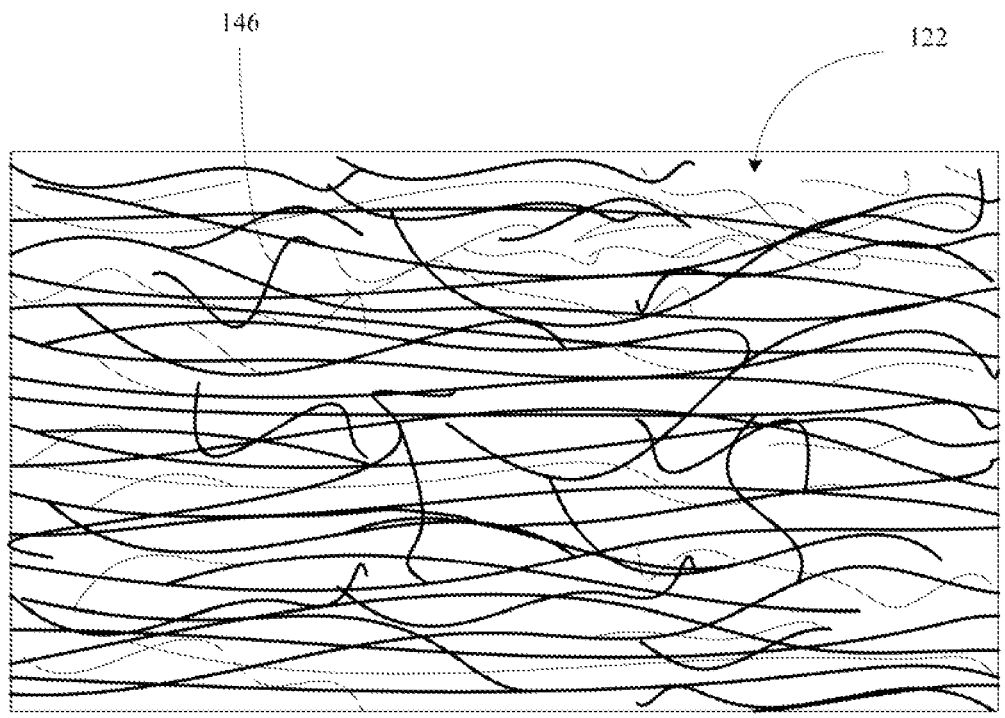
FIG. 7 is a schematic view of the top surface of the carbon nanotube composite structure in FIG. 6.

In the carbon nanotube composite structure 10, the micropores of the carbon nanotube structure 14 are filled with matrix. In one embodiment according to FIGS. 4 and 5, the top surface 122 is almost a slick surface, and the carbon nanotube structure 14 is buried below the top surface 122. Because the matrix 12 is made of transparent material, the carbon nanotube structure 14 can be seen from the top surface 122. Referring to FIGS. 6 and 7, in the enlarged SEM image, the carbon nanotube structure 14 can be seen clearly. Some carbon nanotubes 146 in the carbon nanotube structure 14 protrude from the first surface 142 of the carbon nanotube structure 14, the carbon nanotubes 146 protruding from the first surface 142 of the carbon nanotube structure 14 are also coated by the matrix 12. During the process and because wettability of the liquid matrix and the carbon nanotube structure is good, the liquid matrix will infiltrate into micropores of the carbon nanotube structure, as such, the carbon nanotube structure will be coated by the liquid matrix. Even some carbon nanotubes 146 protrude from the carbon nanotube structure, the protruding carbon nanotubes 146 can be also coated by the liquid matrix. The carbon nanotubes protruding from the first surface 142 also protrude from the surface 122. A thickness of the matrix coated on each of the protruding carbon nanotube is less than 100 nanometers. In some embodiments, the thickness is in a range from about 20 nanometers to about 30 nanometers. In FIG. 6, the protruding carbon nanotubes 146 in the carbon nanotube structure 14 are coated by the matrix, and diameters of the protruding carbon nanotubes are about 70 to about 90 nanometers, and diameters of the carbon nanotubes without being coated by the matrix are about 10 to about 30 nanometers. As such, thickness of the matrix material coated on surfaces of the number of protruding carbon nanotubes is about 30 nanometers.

Figure 8:
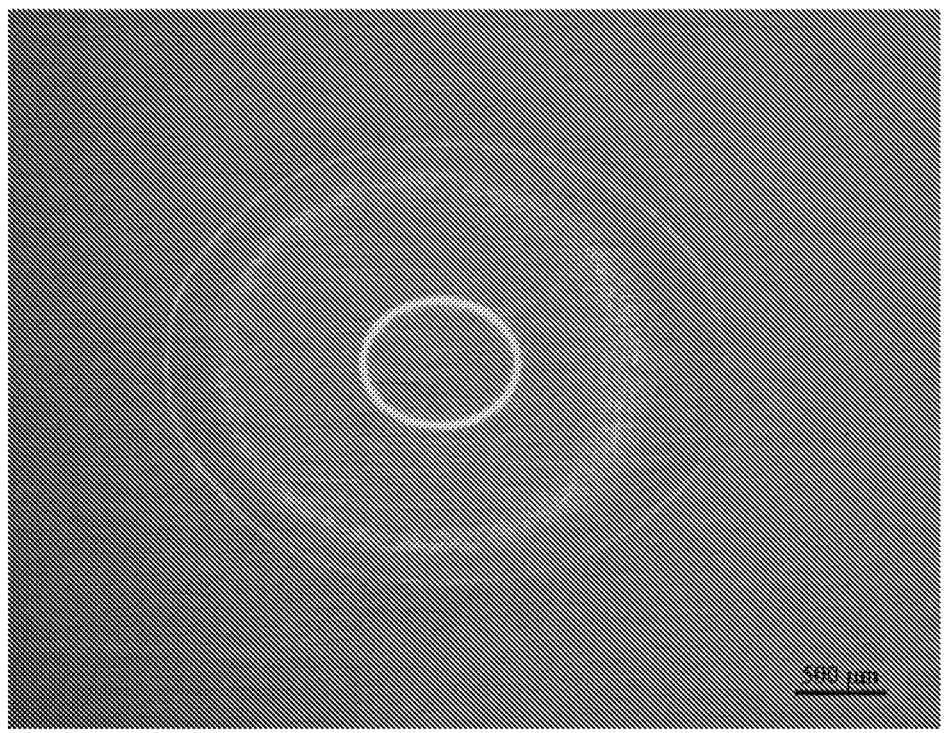
FIG. 8 is a photo of the wetting quality of the carbon nanotube structure located on the surface of the matrix without dealing with microwaves.
Figure 9:
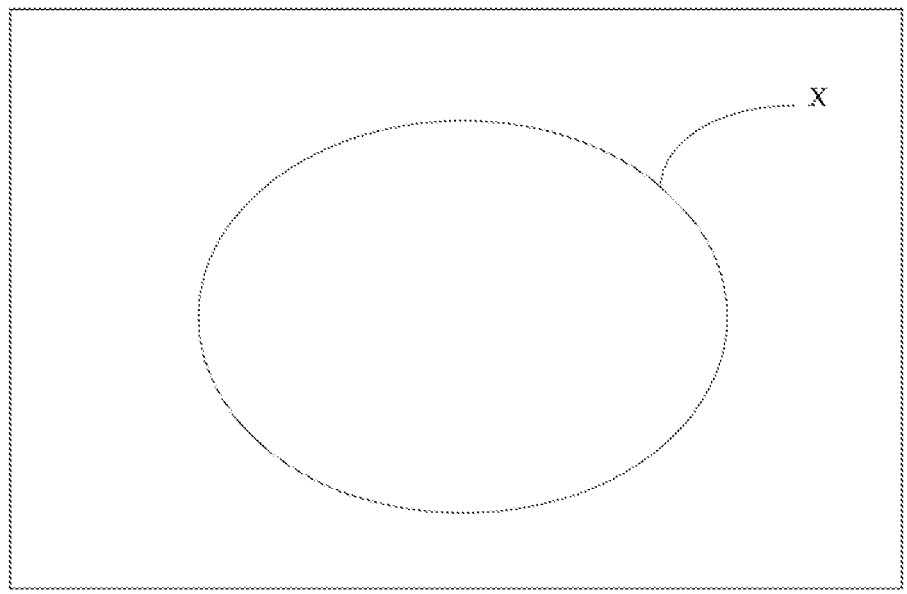
FIG. 9 is a schematic view of FIG. 8.
Figure 10:
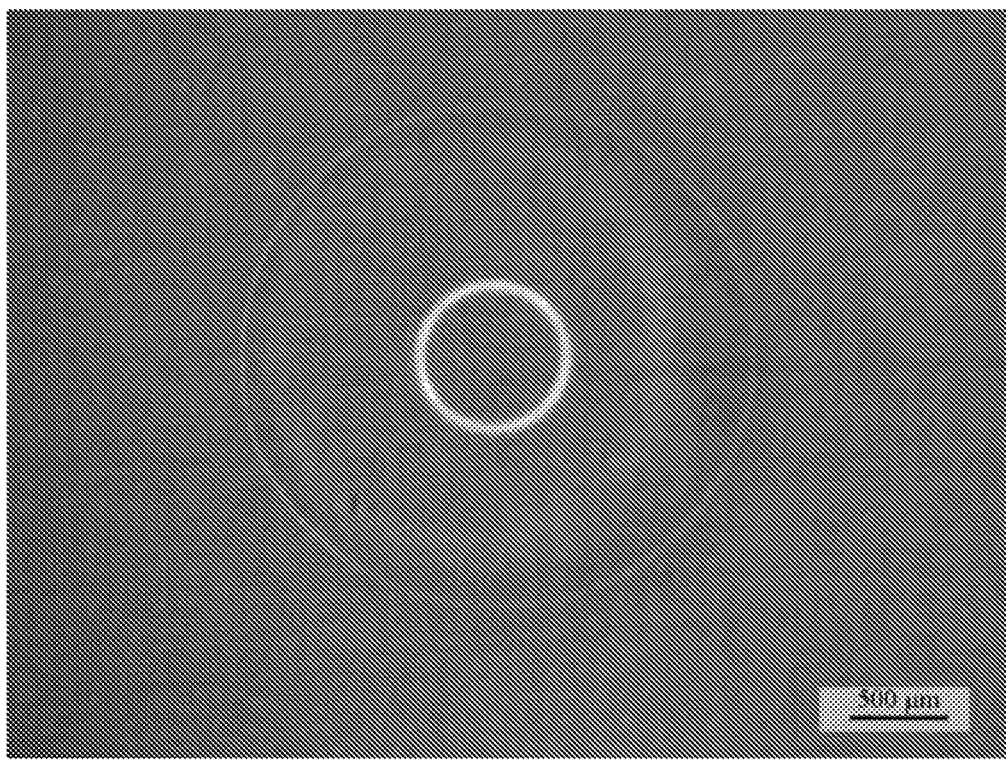
FIG. 10 is a photo of the wetting quality of the carbon nanotube composite structure.
Figure 11:
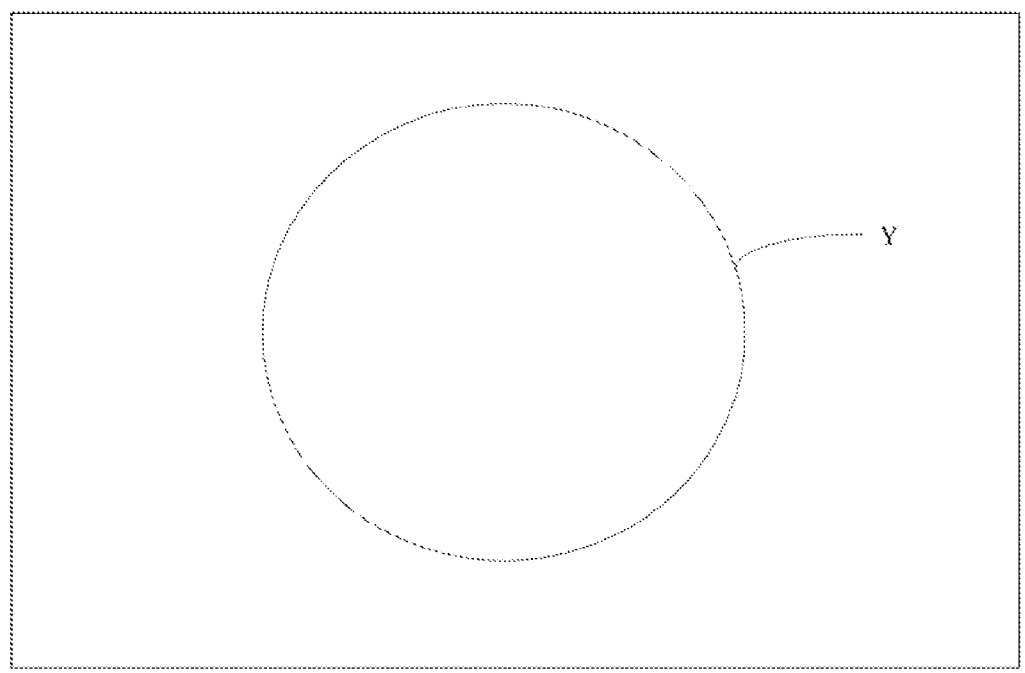
FIG. 11 is a schematic view of FIG. 10.

Referring to FIGS. 8 and 9, if a water drop is applied on a surface of the carbon nanotube structure 14, including a carbon nanotube drawn film located on the surface of the matrix. The water drop will spread on the carbon nanotube structure 14 along the direction of the carbon nanotubes to form an ellipse structure X having an area about 5.69 mm² because the carbon nanotubes in the drawn carbon nanotube film are oriented in a same direction. Referring to FIGS. 10 and 11, after the carbon nanotube structure 14 and the matrix 12 are heated by the microwaves, the carbon nanotube structure 14 is buried under the surface 122. After the water drop is dropped on the surface 122, the water drop will spread to form a round structure Y having an area about 5.14 mm².

Because the thickness of the matrix above the carbon nanotube structure 14 is less than 10 micrometers, the surface 122 of the carbon nanotube composite structure is conductive. A square resistance of the surface 122 is about 5 KΩ. An experiment proved that the conductivity of the surface 122 is almost not affected by friction form outside. The experiment, according to the following steps, is performed to an embodiment of a carbon nanotube composite structure.

providing the carbon nanotube composite structure 10, wherein the carbon nanotube composite structure 10 is a cuboid, an area of the surface 122 is about 8×8 mm$^2$;

applying two electrodes on two opposite side of the surface 122 to measure the square resistance; and scraping the surface 122 with a tip of a needle with a pressure force about 0.7 Newton (N) between the two electrode, wherein the needle has a tip covered by cotton.

During the scraping step, the two electrodes are used to measure the square resistance, and the square resistance changes little by scraping the surface 122 for about 50 times. If the carbon nanotube structure 14 is located on the surface of the matrix without exposing them to microwaves, the needle will easily destroy the carbon nanotube structure 14.

Finally, it is to be understood that the above-described embodiments are intended to illustrate rather than limit the present disclosure. Variations may be made to the embodiments without departing from the spirit of the disclosure as claimed. Elements associated with any of the above embodiments are envisioned to be associated with any other embodiments. The above-described embodiments illustrate the scope of the disclosure but do not restrict the scope of the disclosure.

Depending on the embodiment, certain of the steps of methods described may be removed, others may be added, and the sequence of steps may be altered. It is also to be understood that the description and the claims drawn to a method may include some indication in reference to certain steps. However, the indication used is only to be viewed for identification purposes and not as a suggestion as to an order for the steps.

What is claimed is:

1. A method for making a carbon nanotube composite structure, the method comprising the following steps:
    (a) providing a single matrix sheet having a surface and a carbon nanotube structure;
    (b) placing the carbon nanotube structure on the surface of the matrix sheet, the carbon nanotube structure being above the surface of the matrix sheet, wherein the carbon nanotube structure comprises a plurality of carbon nanotubes;
    (c) exposing the carbon nanotube structure to electromagnetic waves; and
    (d) forming the carbon nanotube composite structure having a conductive surface by heating the surface of the matrix sheet with the carbon nanotube structure causing the carbon nanotube structure to settle into the matrix sheet below the surface of the matrix sheet such that a distance between the surface of the matrix sheet and the carbon nanotube structure is less than 10 micrometers.

2. The method of claim 1, wherein in the step (c), the carbon nanotube structure absorbs the electromagnetic waves and release heat until the carbon nanotube structure embeds into the matrix sheet.

3. The method of claim 2, wherein in the step (c), the carbon nanotube structure defines a plurality of micropores, and material of the matrix sheet seeps into the plurality of micropores.

4. The method of claim 1, wherein in the step (b), the carbon nanotube structure comprises at least one carbon nanotube film, and the at least one carbon nanotube film is a drawn carbon nanotube film comprising a plurality of successively oriented carbon nanotube segments joined end-to-end by van der Waals force therebetween, each carbon nanotube segment comprises carbon nanotubes parallel to each other, and combined by van der Waals force therebetween, and the carbon nanotubes of the drawn carbon nanotube film are substantially aligned along a same direction.

5. The method of claim 4, wherein the carbon nanotube structure comprises a plurality of stacked drawn carbon nanotube films, and the plurality of stacked drawn carbon nanotube films are fabricated by following steps:
    N1: providing an array of carbon nanotubes and a frame;
    N2: pulling out a drawn carbon nanotube film from the array of carbon nanotubes;
    N3: adhering the carbon nanotube film to the frame;
    N4: repeating steps N2 and N3, depositing each successive carbon nanotube film on a preceding drawn carbon nanotube film, thereby achieving at least a two-layer drawn carbon nanotube film; and
    N5: peeling the plurality of stacked drawn carbon nanotube films off the frame to achieve the plurality of stacked drawn carbon nanotube films.

6. The method of claim 5, wherein the step (b) further comprises a substep of applying an organic solvent to the plurality of stacked drawn carbon nanotube films.

7. The method of claim 1, wherein in the step (b), the carbon nanotube structure is a pure structure of carbon nanotubes.

8. The method of claim 1, wherein in the step (c), a power of the electromagnetic waves is in a range from about 200 W to about 2000 W.

9. The method of claim 1, wherein in the step (c), the electromagnetic waves comprises radio frequency, microwave, near infrared or far infrared.

10. The method of claim 9, wherein the electromagnetic waves are microwaves.

11. The method of claim 10, wherein a power of the microwaves is in a range from about 200 W to about 1500 W.

12. The method of claim 1, wherein in step (c), the carbon nanotube structure located on the surface of the matrix sheet is placed in a chamber filled with the electromagnetic waves.

13. The method of claim 12, wherein in step (c), the carbon nanotube structure and the matrix sheet are kept in the chamber for about 1 second to about 300 seconds.

14. The method of claim 1, wherein step (c) is carried out in vacuum environment of about $10^{-2}$ Pascals to about $10^{-6}$ Pascals or in a specific atmosphere of protective gases including nitrogen gas and inert gases.

15. The method of claim 1, wherein the matrix sheet is made of insulative materials having a melting point less than 600° C.

16. A method for making a carbon nanotube composite structure, the method comprising the following steps:
    (a) providing a single matrix sheet having a surface and a carbon nanotube structure;
    (b) placing the carbon nanotube structure on the surface of the matrix sheet, the carbon nanotube structure comprising a plurality of carbon nanotubes and a plurality of micropores; and
    (c) exposing the carbon nanotube structure to microwaves for about 1 second to about 300 seconds, and
    (d) heating the surface of the matrix sheet with the carbon nanotube structure causing the carbon nanotube structure to settle into the matrix sheet below the surface of the matrix sheet such that a distance between the surface of the matrix sheet and the carbon nanotube structure is less than 10 micrometers.

17. The method of claim 16, wherein in step (c), the carbon nanotube structure is formed on the matrix sheet by a coating method or a spraying method.

18. The method of claim 16, wherein step (c) is carried out in vacuum environment of about $10^{-2}$ Pascals to about $10^{-6}$ Pascals or in a specific atmosphere of protective gases comprising and one or more inert gases.

19. The method of claim 18, wherein in step (d), the carbon nanotube structure absorbs the microwaves and is heated to high temperature, the matrix sheet of the surface is heated by the carbon nanotube structure and is melted to permeate through the plurality of micropores of the carbon nanotube structure.

\* \* \* \* \*